(12) United States Patent  (10) Patent No.: US 7,612,388 B2
Bauer et al.  (45) Date of Patent: Nov. 3, 2009

(54) POWER SEMICONDUCTOR ELEMENT WITH AN EMITTER REGION AND A STOP ZONE IN FRONT OF THE EMITTER REGION

(75) Inventors: Josef-Georg Bauer, Markt Indersdorf (DE); Heinrich Brunner, Dorfen (DE); Hans-Joachim Schulze, Ottobrunn (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/761,240

(22) Filed: Jan. 17, 2001

(65) Prior Publication Data

US 2001/0005024 A1 Jun. 28, 2001

Related U.S. Application Data

(63) Continuation of application No. PCT/DE99/02082, filed on Jul. 5, 1999.

(30) Foreign Application Priority Data

Jul. 17, 1998 (DE) ................................ 198 32 310

(51) Int. Cl.
*H01L 29/66* (2006.01)
*H01L 29/74* (2006.01)

(52) U.S. Cl. .................... 257/156; 257/107; 257/148

(58) Field of Classification Search ................ 257/110, 257/144, 152, 163–165, 133, 137–139, 147, 257/341–342, 107, 109, 155–156, 148
See application file for complete search history.

(56) References Cited

U.S. PATENT DOCUMENTS

| | | | | |
|---|---|---|---|---|
| 4,642,669 A | * | 2/1987 | Rogwiller et al. ............. 357/52 |
| 4,881,979 A | * | 11/1989 | Lewis .......................... 136/201 |
| 5,357,130 A | * | 10/1994 | Scholz et al. ................ 257/288 |
| 5,528,058 A | * | 6/1996 | Pike, Jr. et al. ............... 257/142 |
| 5,610,415 A | * | 3/1997 | Schulze ....................... 257/149 |

(Continued)

FOREIGN PATENT DOCUMENTS

DE 39 17 769 A1 12/1990

(Continued)

OTHER PUBLICATIONS

S. M. Sze, "Physics of Semiconductor Devices", Second Edition, John Wiley & Sons 1981, Chapter 1 section 1.4.2 incl. Figure 13.*

(Continued)

*Primary Examiner*—Johannes Mondt
(74) *Attorney, Agent, or Firm*—Laurence A. Greenberg; Werner H. Stemer; Ralph E. Locher

(57) ABSTRACT

The power semiconductor element has an emitter region and a stop zone in front of the emitter region. The conductivities of the emitter region and of the stop zone are opposed to one another. In order to reduce not only the static but also the dynamic loss of the power semiconductor foreign atoms are used in the stop-zone. The foreign atoms have at least one energy level within the band gap of the semiconductor and at least 200 meV away from the conduction band and valence band of the semiconductor.

2 Claims, 2 Drawing Sheets

U.S. PATENT DOCUMENTS 5,668,385 A * 9/1997 Bauer et al. .................. 257/139
5,684,323 A * 11/1997 Tohyama .................... 257/363
6,043,112 A * 3/2000 Francis et al. ............... 438/143

FOREIGN PATENT DOCUMENTS

DE 3917769 A1 * 12/1990
EP 0 621 640 B1 10/1994
EP 0 760 528 A2 3/1997

OTHER PUBLICATIONS

S.M. Sze, "Physics of Semiconductor Devices", Second Edition, John Wiley & Sons, New York (1981), p. 20-2 (previously mad of record, mailed May 15, 2002).*

Rosling et al, "A Study of Design Influence on Anode-Shorted GTO Thyristor Turn-On and Turn-Off", IEEE Transactions on Power Electronics, vol. 9, No. 5, Sep. 1994, pp. 514-521.*

* cited by examiner

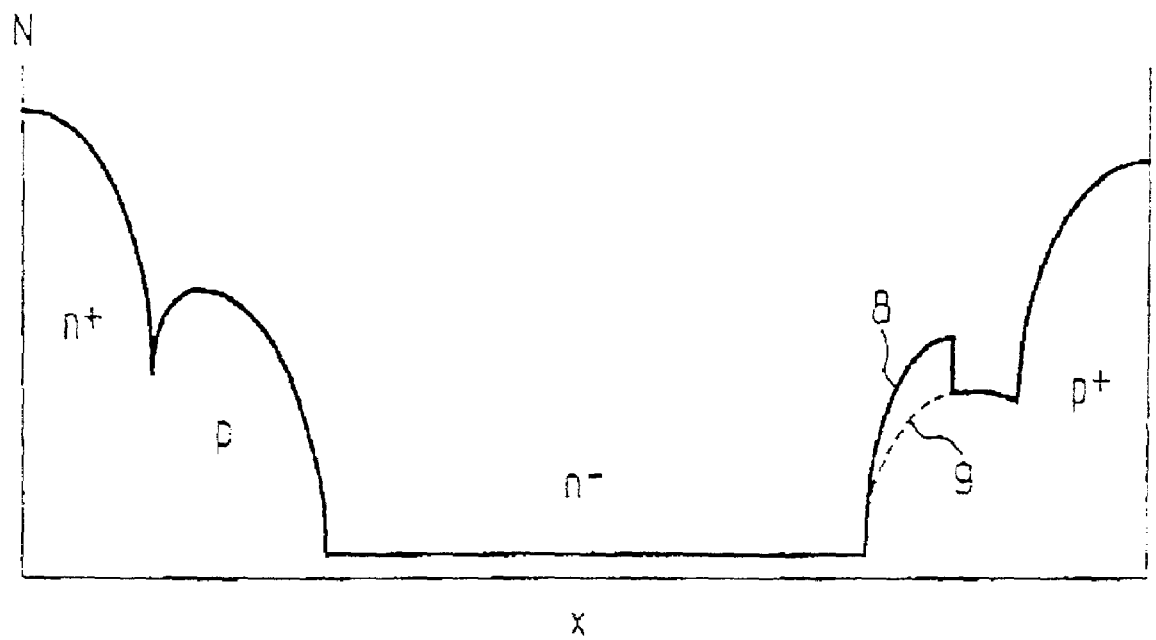

POWER SEMICONDUCTOR ELEMENT WITH AN EMITTER REGION AND A STOP ZONE IN FRONT OF THE EMITTER REGION

CROSS-REFERENCE TO RELATED APPLICATION

This application is a continuation of copending International Application No. PCT/DE99/02082, filed Jul. 5, 1999, which designated the United States and which was not published in the English language.

BACKGROUND OF THE INVENTION

Field of the Invention

The invention relates to a power semiconductor element with an emitter region, in front of which a stop zone is positioned, wherein the conductivities of the emitter region and of the stop zone are opposed to one another.

In asymmetric thyristors, a reduction in the thickness of the component relative to symmetric thyristors is accomplished by positioning an n stop zone in front of the p emitter on the anode side. The n-stop zone is intended to prevent the passage of the electric field to the p-emitter, at reverse voltage. In this way, the reverse zone makes possible a considerable reduction in the total loss of the power semiconductor, particularly when using highly blocking member such as IGBTs or thyristors, which permit a reverse voltage of more than 3 kV and whose more than 500 μm thickness is relatively large.

The higher the stop zone in front of an emitter on the anode side in a thyristor is doped, the less the partial transistor amplification factor $\alpha_{pnp}$ will be, Although this entails on the one hand an increase in the achievable sweep voltage of the thyristor at which the transition from the blocking characteristic line to the flow characteristic line takes place, on the other hand the conduction voltage also increases and with it, the static power loss. The static and dynamic losses of the thyristor are therefore coupled with one another via the characteristics of the stop zone.

SUMMARY OF THE INVENTION

The object of the present invention is to provide a power semiconductor component with an emitter region and a stop zone in front of the emitter region which overcomes the above-noted deficiencies and disadvantages of the prior art devices and methods of this general kind, and in which the static as well as the dynamic loss are less than that with components according to the prior art.

With the above and other objects in view there is provided, in accordance with the invention, a power semiconductor element, comprising:

an emitter region;

a stop zone in front of the emitter region;

the emitter region and the stop zone having mutually opposite conductivities;

the stop zone having foreign atoms with at least one energy level within the band gap of the semiconductor and at least 200 meV away from a conduction band and a valence band of the semiconductor.

The invention is based on the principle that the stop zone needs to be "active" only in the off state of the circuit element, but not during its conducting operation. In other words, the number of effective doping atoms generated by the disruption in the stop zone should change dependent on the type of operation (blocking operation or conducting operation) of the circuit element. This is achieved in that energy levels are created by the doping atoms which, within the band gap of the semiconductor material, lie far away from the energy levels of the conductance band and the valence band.

The power semiconductor element according to the invention with an emitter region in front of which there is formed a stop zone with foreign atoms, wherein the conductivities of the emitter region and the stop zone oppose one another, is characterized in that the foreign atoms in the stop zone have at least one energy level which lies within the band gap of the semiconductor, and which is at least 200 meV away from the conduction band and the valence band of the semiconductor.

In accordance with a concomitant feature of the invention, the foreign atoms in the stop zone are sulfur or selenium atoms.

An advantage of the power semiconductor with a stop-zone doped with sulfur is that the diffusion constant of the sulfur atoms is very high and therefore the stop zone can be easily generated.

Other features which are considered as characteristic for the invention are set forth in the appended claims.

Although the invention is illustrated and described herein as embodied in a power semiconductor element with a n emitter region, in front of which a stop-zone is positioned, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a graph showing the concentration of the doping material of the component according to FIG. 1.

DESCRIPTION OF THE PREFERRED EMBODIMENTS

Figure 1:
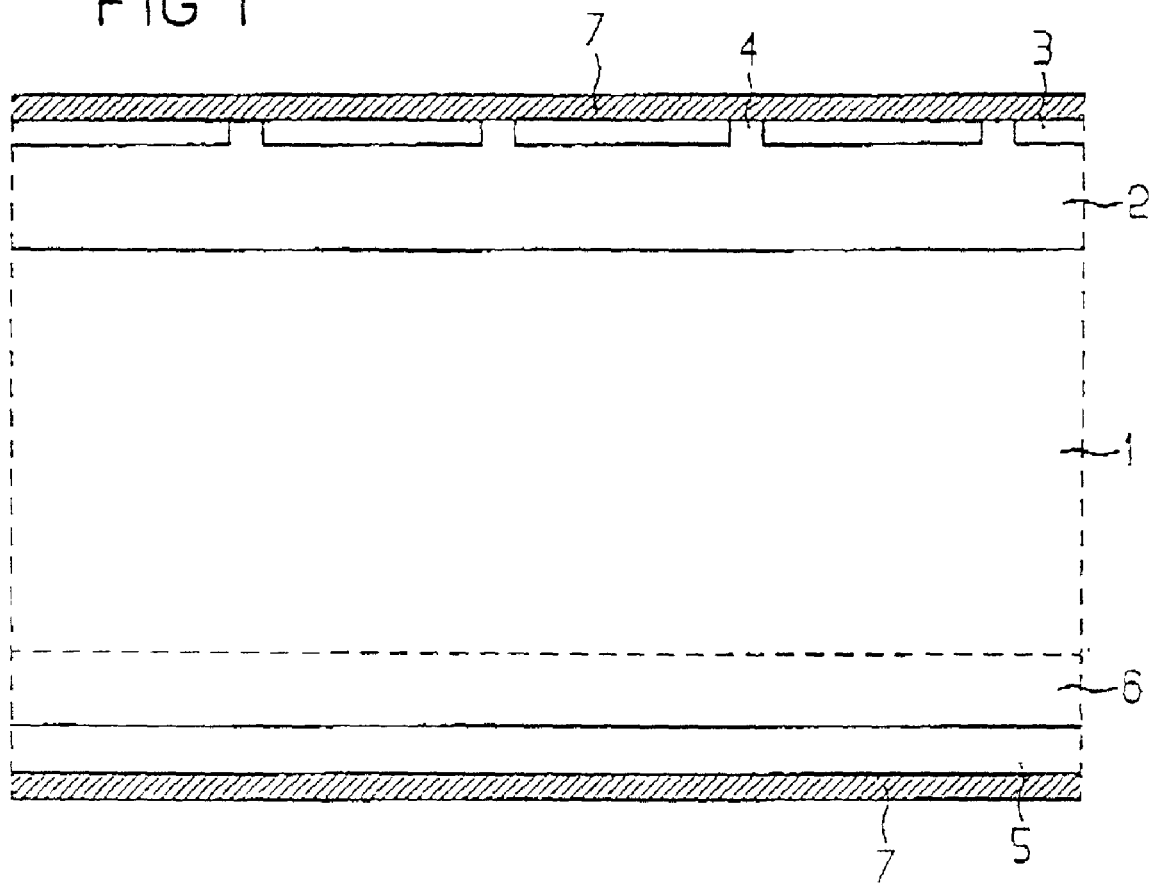
FIG. 1 is a partial sectional view of an embodiment of the power semiconductor according to the invention with a stop-zone on the anode side.

Referring now to the figures of the drawing in detail and first, particularly, to FIG. 1 thereof, there is seen a part of a power semiconductor element in the form of a thyristor. The thyristor comprises a semiconductor substrate 1 which, in the embodiment shown, is weakly n-doped, and which functions as an $n^-$-basis semiconductor substrate. A p-basis 2 is connected to the $n^-$-basis or semiconductor substrate 1, on the surface of which p-basis an $n^+$-emitter structure 3 on the cathode side is arranged with cathode short circuits 4.

On the side of the $n^-$-basis 1 opposite the p-basis 2, a p-emitter 5 is located on the anode side. As is known in the prior art, the p-emitter 5 is shielded by a stop zone 6 at reverse voltage from the passage of the field. The stop zone 6 is n-doped. Phosphorous or arsenic is used as the doping agent in the prior art.

Both emitters 3 and 5 are electrically connected via metallizations 7 with an external anode connection or cathode connection.

According to the invention, the stop-zone 6 is doped with a dopant the energy levels of which in the band gap lie far, i.e. at least 200 meV, away from the valence band or conduction band. In addition to other atoms, sulfur atoms in particular represent suitable doping agents since these are partially electrically active at room temperature.

However, if the sulfur doped region is surrounded by a space charge region, these sulfur atoms become completely active as double donators, i.e. donators with two released charge carriers, so that a sulfur atom is doubly charged. The energy levels of sulfur lie so low in the silicon band gap that they are only completely electrically activated upon establishing a space charge region: One sulfur energy level lies 260 meV below the conduction band in silicon, and a second energy level lies 480 meV above the valence band. The silicon band gap is 1120 meV. This therefore means that on the one hand, the stop zone is only partially electrically active in the on-state; the partial transistor amplification factor $\alpha_{pnp}$ is therefore depressed only relatively little and the on state voltage can thereby be kept low. The part of the stop zone in the off voltage condition surrounded by the space charge region can on the other hand be completely activated, which therefore results in a very effective stop zone. Therefore, the correlation between on-state voltage and off state voltage is improved.

A further embodiment of the power semiconductor element according to the invention has selenium as the doping material. Selenium has two energy levels within the band gap in Si lying about 310 meV and 590 meV below the conduction band.

The doping profile of the circuit element according to FIG. 1 is represented in FIG. 2. The emitter 3 on the cathode side shown at far left in FIG. 2 is $n^+$-doped. Connected hereto in the following order are the p-basis 2, the $n^-$-basis 1, the stop zone 6, and the p emitter 5. In the stop zone 6 generated by the atoms of the doping agent, two doping gradients are shown, indicated as 8 and 9, respectively. The gradient 9 is represented as a dotted line. Whereas the doping gradient 8 of the stop zone 6 assumes a gradient in the area of the space charge region which, seen from the $n^-$-basis 1, rises steeply, thereby preventing a passage of the field to the p-emitter 5, the gradient of the doping profile 9 of the stop zone 6 is flattened in the on state voltage, i.e. the charge carriers travel out of the $n^-$-basis 1 to the p-emitter 5 or vice versa, wherein they "perceive" a markedly weaker stop zone 6.

In the production of a power semiconductor, a stop-zone is generated before the emitter region, for example by anode side implantation of foreign atoms. Following the implantation of foreign atoms such as phosphorous or arsenic, the foreign atoms or doping atoms for generating the n-doped stop-zone 6 are diffused into the silicon slice and the crystal lattice is annealed. To this end, the semiconductor is subjected to a temperature treatment step. The temperature and the length of the treatment, depend on the characteristics of the doping atoms and of the semiconductor material. Due to the low diffusion constant of phosphorous and arsenic in silicon, relatively high diffusion temperatures and long diffusion times must be chosen in the temperature treatment step after implantation, namely temperatures of more than 1200° C. and diffusion times of typically longer than 20 hours.

An advantage of sulfur as the doping agent in the generation of the stop-zone 6 is that it diffuses relatively quickly into the silicon. This allows the diffusion time and the temperature to be markedly reduced. Incorporation of the sulfur atoms can take place by an ion implantation on the anode side with a subsequent driving-in step. Typically, an implantation dose of between $10^{12}$ and $10^{14}$ sulfur atoms per $cm^2$ is used. In this way, and in contrast to phosphorous as the doping substance, sulfur results in a reduction of the voltage in on-state operation of approximately 10% at a dose of approximately $5 \times 10^{12}$ sulfur atoms per $cm^2$.

The invention is described above with reference to a thyristor as a power semiconductor. Those of skill in the art will readily understand, however, that the technical teaching disclosed herein can also be applied to other power circuit elements such as IGMTs, and so on.

We claim:

1. A power semiconductor element, comprising:
an emitter region; and
a stop zone in front of said emitter region, the stop zone and said emitter region having mutually opposite conductivities, the stop zone including sulfur atoms with at least one energy level within the band gap of the semiconductor and at least 200 meV away from both a conduction band and a valence band of the semiconductor, the stop zone having a doping profile of sulfur atoms such that the stop zone is only partially electrically active in the on-state and fully electrically active in the off-state for carriers emitted by the emitter region.

2. A power semiconductor element, comprising:
an emitter region; and
a stop zone in front of said emitter region, the stop zone and said emitter region having mutually opposite conductivities, the stop zone including selenium atoms with at least one energy level within the band gap of the semiconductor and at least 200 meV away from both a conduction band and a valence band of the semiconductor, the stop zone having a doping profile of selenium atoms such that the stop zone is only partially electrically active in the on-state and fully electrically active in the off-state for carriers emitted by the emitter region.

* * * * *